United States Patent
Song et al.

(10) Patent No.: US 7,906,397 B2
(45) Date of Patent: Mar. 15, 2011

(54) METHODS OF FABRICATING NONVOLATILE SEMICONDUCTOR MEMORY DEVICES INCLUDING A PLURALITY OF STRIPES HAVING IMPURITY LAYERS THEREIN

(75) Inventors: Ki-whan Song, Seoul (KR); Byung-Gook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/410,010

(22) Filed: Mar. 24, 2009

(65) Prior Publication Data

US 2009/0239345 A1 Sep. 24, 2009

Related U.S. Application Data

(62) Division of application No. 11/520,886, filed on Sep. 14, 2006, now Pat. No. 7,525,146.

(30) Foreign Application Priority Data

Sep. 15, 2005 (KR) .................. 10-2005-0086443

(51) Int. Cl.
*H01L 21/336* (2006.01)
(52) U.S. Cl. ...................................... 438/259; 438/211
(58) Field of Classification Search ............ 438/211, 438/259
See application file for complete search history.

(56) References Cited

U.S. PATENT DOCUMENTS

| | | | | |
|---|---|---|---|---|
| 5,936,274 A * | 8/1999 | Forbes et al. | ............... | 257/315 |
| 6,150,687 A | 11/2000 | Noble et al. | ............... | 257/302 |
| 6,677,204 B2 | 1/2004 | Cleeves et al. | ............... | 438/268 |
| 6,881,994 B2 * | 4/2005 | Lee et al. | ............... | 257/296 |
| 7,442,988 B2 * | 10/2008 | Oh et al. | ............... | 257/321 |
| 7,525,145 B2 * | 4/2009 | Shukuri | ............... | 257/311 |
| 2002/0034855 A1 | 3/2002 | Horiguchi et al. | | |
| 2004/0232471 A1 * | 11/2004 | Shukuri | ............... | 257/314 |

FOREIGN PATENT DOCUMENTS

| | | |
|---|---|---|
| JP | 2002-083945 | 3/2002 |
| JP | 2002-246571 | 8/2002 |
| JP | 2003-086712 | 3/2003 |
| JP | 2003-218242 | 7/2003 |

OTHER PUBLICATIONS

Notice to File a Response/Amendment to the Examination Report for corresponding Korean Application No. 10-2005-0086443, Mailed Oct. 20, 2006.

\* cited by examiner

*Primary Examiner* — Thanh V Pham
*Assistant Examiner* — Caleb Henry
(74) *Attorney, Agent, or Firm* — Myers Bigel Sibley & Sajovec

(57) ABSTRACT

A nonvolatile semiconductor memory device includes a plurality of pillars protruding upward from a semiconductor substrate and having respective top surfaces and opposing sidewalls, a bit line on the top surfaces of the pillars and connecting a row of the pillars along a first direction, a pair of word lines on the opposing sidewalls of one of the plurality of pillars and crossing beneath the bit line, and a pair of memory layers interposed between respective ones of the pair of word lines and the one of the plurality of pillars. Methods of fabricating a nonvolatile semiconductor memory device include selectively etching a semiconductor substrate to form pluralities of stripes having opposing sidewalls and being arranged along a direction, forming memory layers and word lines along the sidewalls of the stripes selectively etching the stripes to form a plurality of pillars, and forming a bit line connecting the pillars and crossing above the word lines.

13 Claims, 13 Drawing Sheets

METHODS OF FABRICATING NONVOLATILE SEMICONDUCTOR MEMORY DEVICES INCLUDING A PLURALITY OF STRIPES HAVING IMPURITY LAYERS THEREIN

This application is a divisional of U.S. patent application Ser. No. 11/520,886, filed Sep. 14, 2006, now U.S. Patent No. 7,525,146, which claims priority to Korean Patent Application No. 10-2005-0086443, filed Sep. 15, 2005, the disclosures of which are hereby incorporated herein by reference.

FIELD OF THE INVENTION

The present invention is directed to nonvolatile semiconductor memory devices and methods of fabricating the same. In particular, the present invention relates to nonvolatile semiconductor memory devices with vertical channel transistors and to methods for fabricating the same.

BACKGROUND

Semiconductor memory devices used for storing binary data are typically classified as volatile or nonvolatile semiconductor memory devices. Volatile semiconductor memories may lose their data if electric power thereto is turned off, while nonvolatile semiconductor memories may maintain their data even if electric power is turned off. SRAMs (static random access memories) and DRAMs (dynamic random access memories) are typical kinds of volatile semiconductor memories, while flash memories are typical nonvolatile semiconductor memories.

SRAM memory devices may have high reading and writing speeds and low power consumption. However, SRAM devices may be disadvantageous for high levels of integration, because an SRAM unit cell may include six transistors. The DRAM unit cell may be smaller than the SRAM unit cell in area, because a DRAM cell may include only one transistor and one capacitor.

Since a flash memory device may have a unit cell that is similar to a MOS transistor without a data storage element like the capacitor of a DRAM cell, the level of integration of flash memory devices can be relatively high. Depending on the structural features of their cells, flash memory devices can be classified as floating-gate or floating-trap type flash memory devices. A floating-gate flash memory device has floating gates isolated with insulation films between a semiconductor substrate and word lines. Data is stored in a floating-gate flash memory device by injecting electric charges into the floating gates. Floating-trap flash memory devices store data by injecting electric charges into trap sites formed within non-conductive charge-trapping layers between word lines and the semiconductor substrate.

A general structure of flash memory device is shown in FIG. 1.

Referring to FIG. 1, bit lines BL for connection to a peripheral circuit or an external power supply are arranged on a semiconductor substrate 1. Word lines WL are arranged on the substrate 1, perpendicular to and crossing the bit lines BL. Memory cells M are positioned in the regions in which the bit lines BL and word lines WL cross each other. The word lines WL correspond to gate electrodes of transistors constituting the memory cells, and memory layers (not shown) are formed between the word lines WL and the semiconductor substrate 1. In a floating-trap flash memory device, the memory layer includes a tunnel insulation film, a charge trapping film, and a blocking insulation film. The charge-trapping film includes a trapping level in which electric charges can be captured. In storing or erasing data, electric charges are injected into or emitted from a specific cell by supplying appropriate voltages to the corresponding word line WL and bit line BL of the cell.

In FIG. 1, the symbol 'F', which is the minimum obtainable feature size, defines the width of the word lines WL and the bit lines BL, and also the interval between the adjacent word lines and/or the adjacent bit lines. Thus, a unit cell M occupies an area of dimension $4F^2$. Such a feature size may be less than that of an SRAM or DRAM cell. On the other hand, there are some kinds of flash memories that may have a feature size of up to $6F^2$ or $10F^2$.

SUMMARY

A nonvolatile semiconductor memory device according to some embodiments of the invention includes a plurality of pillars protruding upward from a semiconductor substrate and having respective top surfaces and opposing sidewalls, a bit line on the top surfaces of the pillars and connecting a row of the pillars along a first direction. A pair of word lines is on the opposing sidewalls of one of the plurality of pillars and crossing beneath the bit line, and a pair of memory layers is interposed between respective ones of the pair of word lines and the one of the plurality of pillars.

The one of the plurality of pillars may include source and drain regions spaced apart vertically therein and defining a pair of vertical channel transistors together with the pair of word lines.

The source region may be disposed along the lower portion of the pillar and a surface of the semiconductor substrate.

The memory device may further include a channel region between the source and drain regions. The channel region may be conductively connected to the substrate.

The memory layers may extend between a surface of the semiconductor substrate and a bottom edge of the word lines.

Each of the memory layers may include a tunneling insulation film, a charge storage film, and a blocking insulation film.

Methods of fabricating a nonvolatile semiconductor memory device according to some embodiments of the invention include selectively etching a semiconductor substrate to form a plurality of stripes having opposing sidewalls and being arranged along a direction, forming memory layers and word lines along the sidewalls of the stripes, selectively etching the stripes to form pluralities of pillars, and forming a bit line connecting a row of adjacent ones of the pillars and crossing the word lines.

The methods may further include depositing a conductive film on the semiconductor substrate including the memory layers, and conducting an etch-back process to form the word lines.

The methods may further include forming impurity layers at a surface of the semiconductor substrate and in a region under the surface of the semiconductor substrate before forming the stripes.

Forming the plurality of pillars may include filling spaces between the word lines with a first insulation film, forming a mask to selectively expose a portion of the stripes, removing the exposed portion of the stripes to form the pillars, and filling spaces between the pillars with a second insulation film.

The bit line may be formed in self-alignment with the pillars.

The methods may further include implanting dopant atoms into the semiconductor substrate in spaces between the stripes before filling the spaces between the stripes with the first insulation film and after forming the memory layers and the word lines. The methods may further include implanting dopant atoms into the semiconductor substrate in the spaces between the pillars before filling the spaces between the pillars with the second insulation film.

Each of the memory layers may include a tunneling insulation film, a charge storage film, and a blocking insulation film.

BRIEF DESCRIPTION OF THE FIGURES

The accompanying drawings are included to provide a further understanding of the invention, and are incorporated in and constitute a part of this specification. The drawings illustrate example embodiments of the invention and, together with the description, serve to explain principles of the present invention. In the drawings:

FIGS. 3A through 3E are sectional views illustrating certain features of a nonvolatile memory device according to embodiments of the invention, in which FIGS. 3A, 3B, 3C, 3D, and 3E are taken along lines I-I', IV-IV' and V-V' of FIG. 2, respectively;

FIGS. 4A through 4E are sectional views illustrating certain features of a nonvolatile memory device according to further embodiments of the invention, in which FIGS. 4A, 4B, 4C, 4D, and 4E are taken along lines I-I', II-II', III-III', IV-IV' and V-V' of FIG. 2, respectively; and FIGS. 5A through FIG. 10A and 5B through 10B are sectional views showing processing steps in accordance some embodiments of the invention, in which FIGS. 5A through 10A are taken along line I-I' of FIG. 2 while FIGS. 5B through 10B are taken along line III-III' of FIG. 2.

DETAILED DESCRIPTION OF EMBODIMENTS OF THE INVENTION

Figure 1:
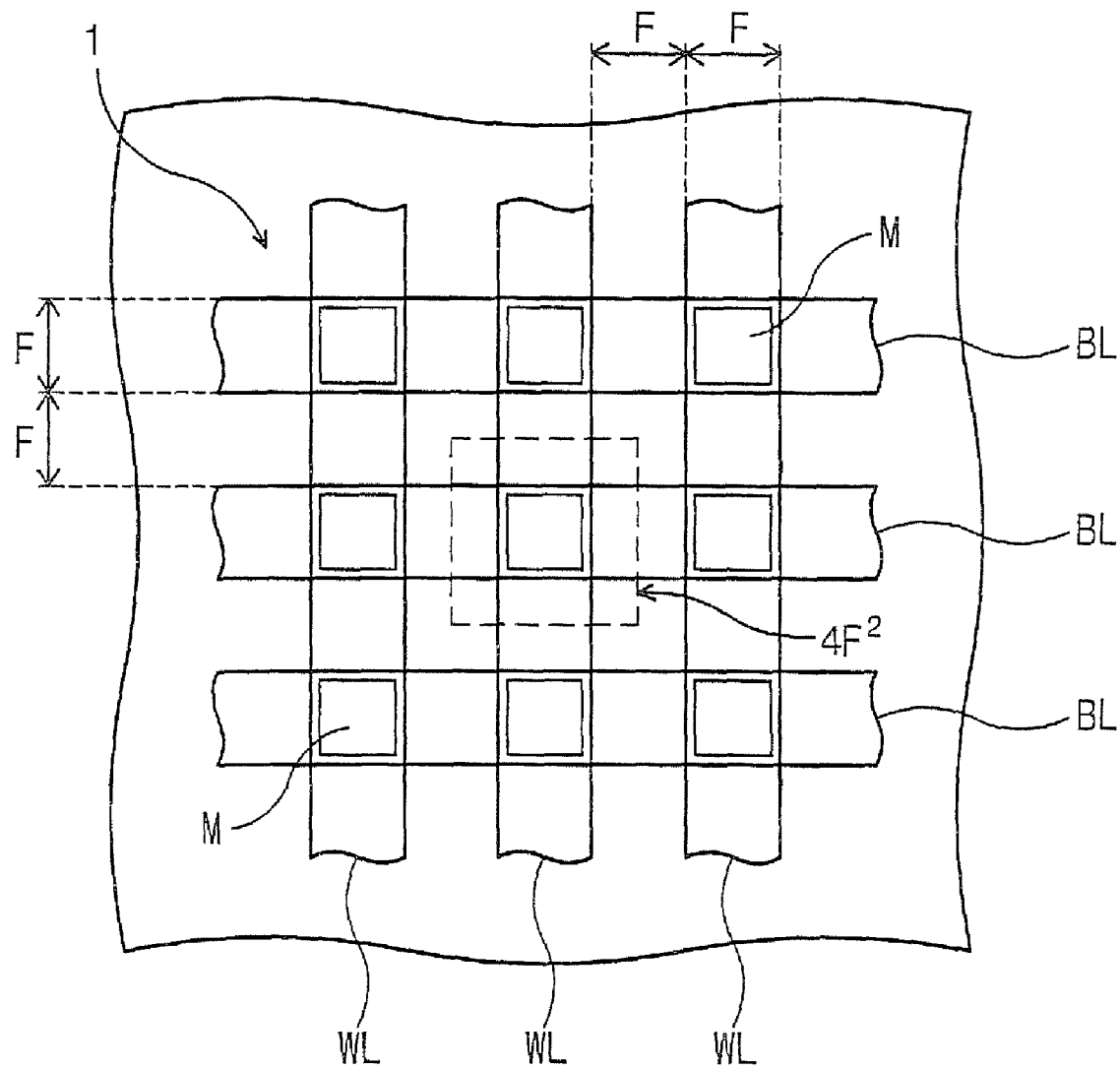
FIG. 1 is a plan view showing a conventional flash memory device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

It also will be understood that, as used herein, the terms "row" and "column" indicate two non-parallel directions that may be orthogonal to one another. However, the terms row and column do not indicate a particular horizontal or vertical orientation.

Figure 2:
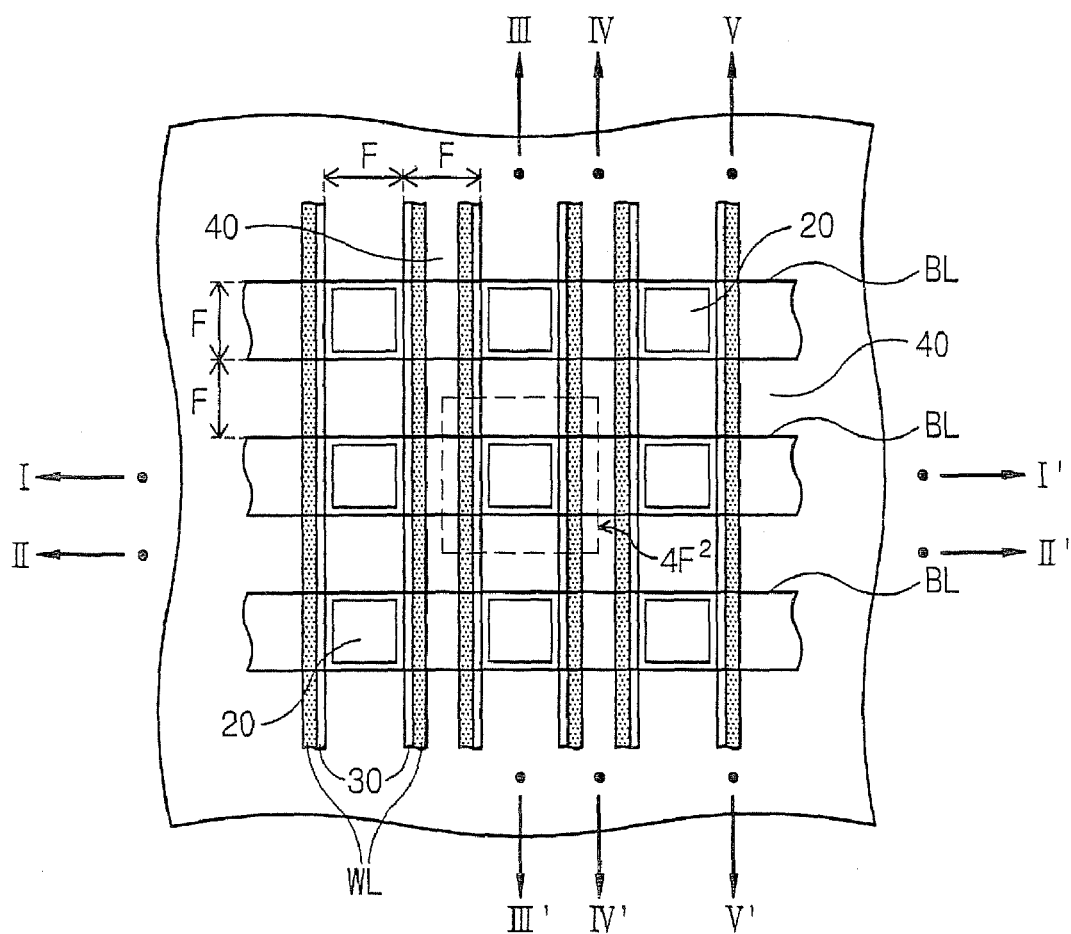
FIG. 2 is a plan view illustrating a nonvolatile memory device in accordance with some embodiments of the invention.

FIG. 2 is a plan view showing a nonvolatile memory device according to some embodiments of the present invention.

Referring to FIG. 2, a plurality of parallel bit lines BL are arranged on a semiconductor substrate 10 along a horizontal direction (i.e., crosswise in FIG. 2). a plurality of parallel word lines WL are formed to cross the bit lines BL in a vertical direction (i.e., lengthwise in the FIG. 2). Pillars 20 are formed beneath the bit lines BL and protrude from the semiconductor substrate 10. The word lines WL and memory layers 30 are disposed on opposing sides of the pillars 20. That is, the word lines WL are arranged at both sides of each pillar 20. A side of the word line WL adjacent the pillar 20 is referred to as the 'inner side' while the side of the word line WL disposed opposite the pillar 20 is referred to as the 'outer side'. Therefore, the pillars 20 are disposed at the regions where the bit lines BL cross the inner sides of a pair of word lines WL. The word lines WL are coupled with the memory layers 30 along the vertical direction. Lengthwise spaces between the pillars 20 are filled with an interlayer insulation film 40. Along the crosswise direction, the interlayer insulation film 40 is also formed in the inner sides of the word-line pairs surrounding the pillars 20. A plurality of pillars 20 are provided on the semiconductor substrate 10, and are conductively isolated from each other. The memory layers 30 each include charge storage films. As a pair of the memory layers 30 is provided at both sides of each pillar 20, each pillar 20 can store two bits of information.

Still referring to FIG. 2, assuming that the minimum feature size 'F' represents the width of the pillar 20, and also a crosswise or lengthwise interval between the adjacent pillars, a unit storage element occupies an area of dimension $2F^2$. This dimensional effect is achieved because the memory layer 30 including two charge storage films at the both sides of the pillar 20 is able to store two bits in total, while the unit pillar 20 occupies an area of dimension $4F^2$. Therefore, a memory device according to some embodiments of the invention may provide a high level of integration, since a bit of information may be stored in a memory space that is half the size of the conventional memory device shown in FIG. 1. According to some embodiments of the invention, the word lines WL can be formed at both sides of the pillars 20 by a process similar to the formation of gate spacers of a typical MOS transistor. Since the word lines WL are formed in the spaces between the pillars 20, which are typically filled with the interlayer insulation film 40 for electrical isolation between conductive elements therein, additional spaces for the word lines WL may not be needed.

A vertical memory device according to some embodiments of the invention with an N-type transistor will now be described. FIGS. 3A through 3E are sectional views illustrating certain features of the nonvolatile memory device shown in FIG. 2 in accordance with some embodiments of the invention. FIGS. 3A, 3B, 3C, 3D, and 3E are taken along lines I-I', II-II', III-III', IV-IV' and V-V' of FIG. 2, respectively.

Figure 3A:
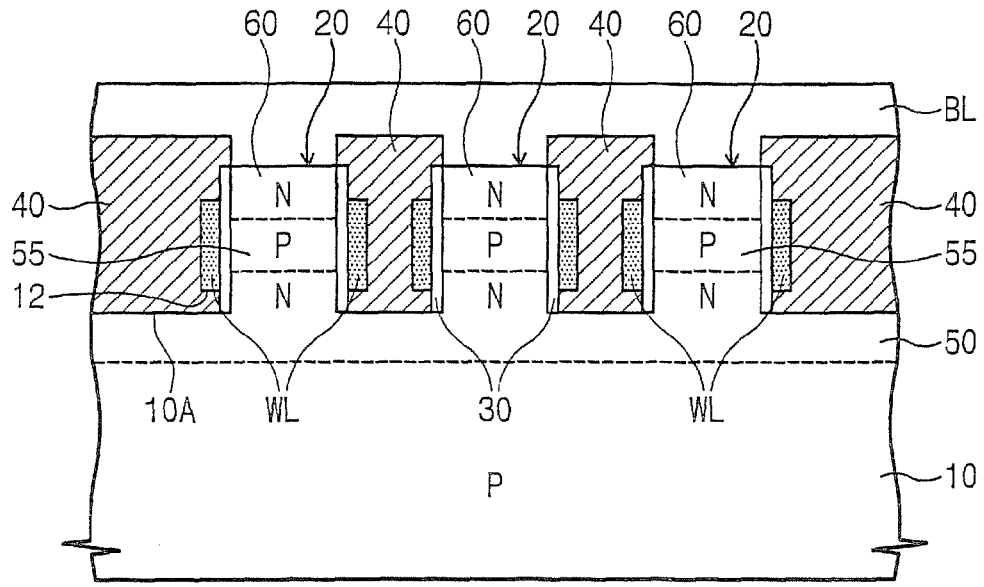
Figure 3B:
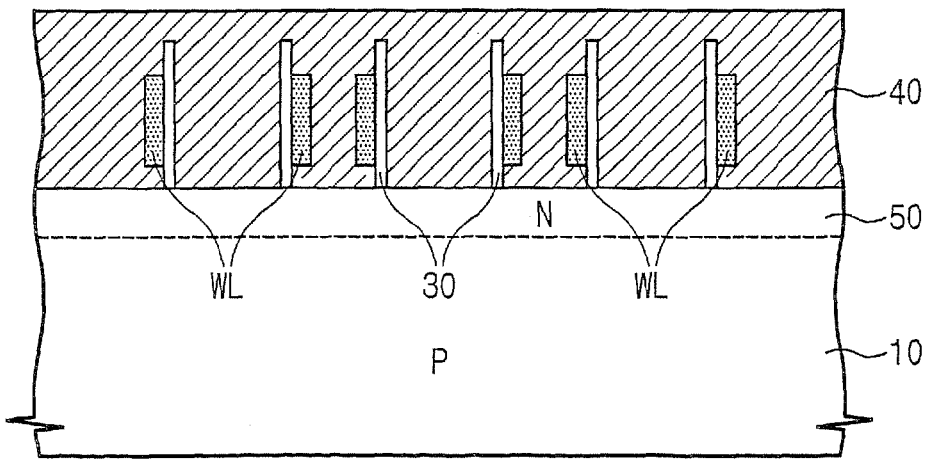

FIGS. 3A and 3B are sectional views along the crosswise (horizontal) direction of a bit line BL of FIG. 2. FIG. 3A shows a section of the bit line BL while FIG. 3B shows a section of a space between adjacent bit lines BL.

Referring to FIG. 3A, the pillars 20 are formed to protrude upward from the semiconductor substrate 10. A bit line BL is formed across adjacent pillars 20 to connect the pillars 20 with each other. Memory layers 30 and the word lines WL are formed on both sides of each pillar 20. Spaces between the pillars 20 are filled up with the interlayer insulation film 40. The lower and upper portions of the pillar 20 include source and drain regions 50 and 60 which contain electrical dopants. Thus, the unit structure of a pillar 20 includes a pair of vertical channel transistors, with the pair of word lines WL acting as gate electrodes on opposing sides of the pillar 20. The doped source and drain regions 50 and 60 are located at the lower and upper portions of the pillar 20. If the vertical channel transistor is an N-type transistor, the source and drain regions 50 and 60 may be doped using N-type dopants in a P-type substrate 10. A channel region 55 is formed between the source and drain regions 50 and 60. As shown in FIG. 3A, the source regions 50 may be connected with each other along the bottoms of the pillars 20 and the surface of the semiconductor substrate 10. In this case, it may be possible to save space for contacts which may otherwise be used to electrically connect the source regions 50 to each other.

In a floating-trap flash memory device according to embodiments of the invention, the memory layer 30 includes a tunnel insulation film, a charge storage film, and a blocking insulation film. The tunnel insulation film may be formed of a thermal oxide (such as $SiO_2$), which may be obtained, for example, by oxidizing a silicon substrate. The charge storage film includes an insulation film higher in trap density and electron affinity than the tunnel or blocking insulation films. For example, the charge storage film may include silicon nitride ($Si_3N_4$), silicon oxynitride (SiON), and/or a or ferroelectric material. The blocking insulation film may be formed of a typical silicon oxide film, but may alternatively or additionally be made of metal oxide such as aluminum oxide ($Al_2O_3$) having a relatively large energy bandgap and/or a high dielectric constant. The memory layer 30 may be formed to cover both sides of the pillar 20.

The word lines WL, which are formed on the outer sides of the memory layers 30, correspond to the gate electrodes of the vertical channel transistors. The word lines WL may be formed of polysilicon and/or a composite of metal and metal silicide for lowering resistance therein. The word lines WL are disposed to vertically overlap with the channel region 55. Further, both vertical ends of the word line WL may overlap partially with the source and drain regions 50 and 60. As shown in FIG. 3A, there may be a spatial gap between the upper face 10A of the substrate 10, adjacent to the bottom of the pillar 20, and the lower edge 12 of the word line WL. This gap may be filled with the interlayer insulation film 40 to electrically isolate the adjacent pillars 20 from each other. In some embodiments, however, the memory layer 30 may extend to at least partially cover the upper face of the semiconductor substrate 10 and/or at least partially fill the gap between the lower edge 12 of the word line WL and the upper face 10A of the semiconductor substrate 10.

Since each pillar 20 corresponds to a unit storage element capable of storing two information bits, it is desirable to electrically isolate the pillars 20 from each other. In order to isolate the pillars 20, the interlayer insulation film 40 is interposed between the pillars 20 along both the crosswise (horizontal) and lengthwise (vertical) directions shown in FIG. 2. It should be understood that the same reference numeral is assigned both to the crosswise and lengthwise portions of the interlayer insulation film 40, because they may be substantially similar to each other although they may be formed at different times. From the section between the bit lines BL as shown in FIG. 3B, it can be seen that the pillars 20 are arranged to be isolated from each other by the interlayer insulation film 40, while the memory layers 30 and the word lines WL extend continuously along the lengthwise direction of the bit lines BL.

Figure 3C:
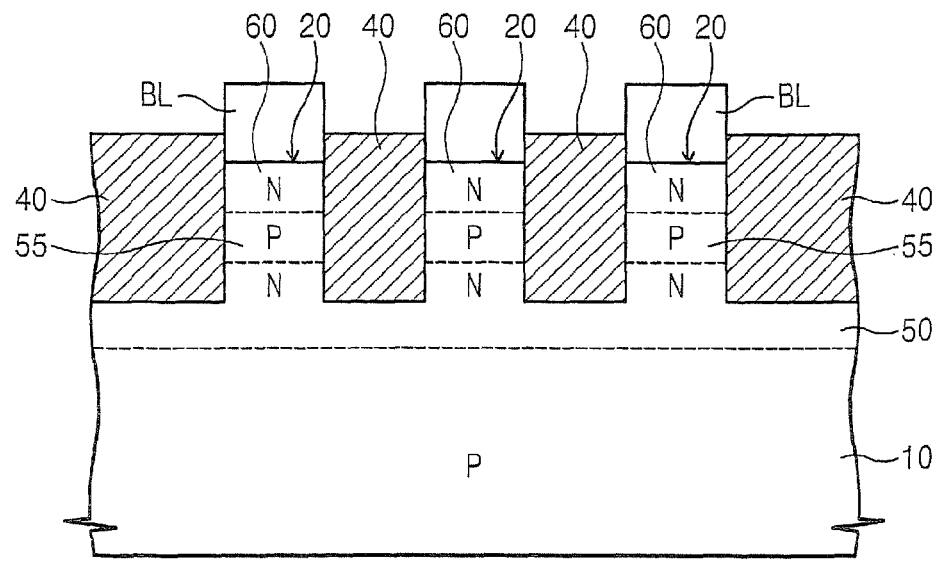
Figure 3D:
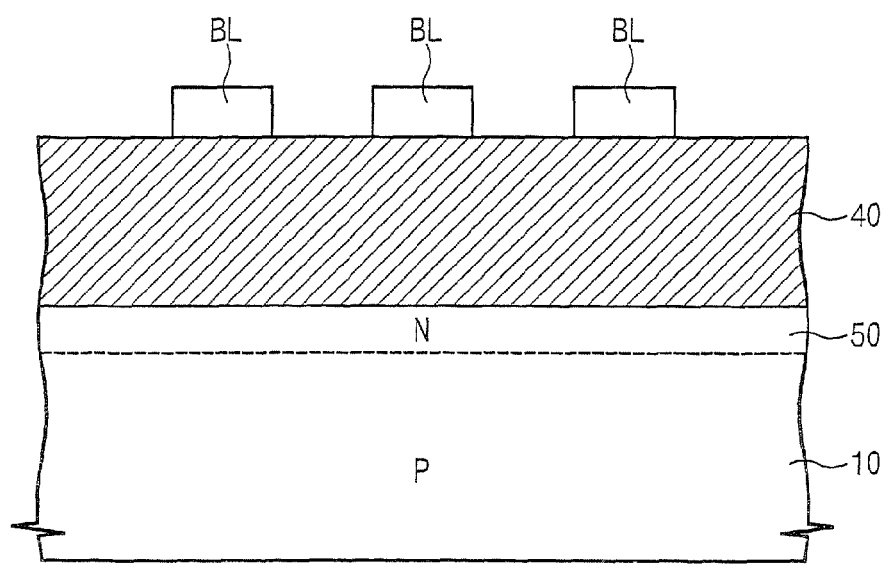
Figure 3E:
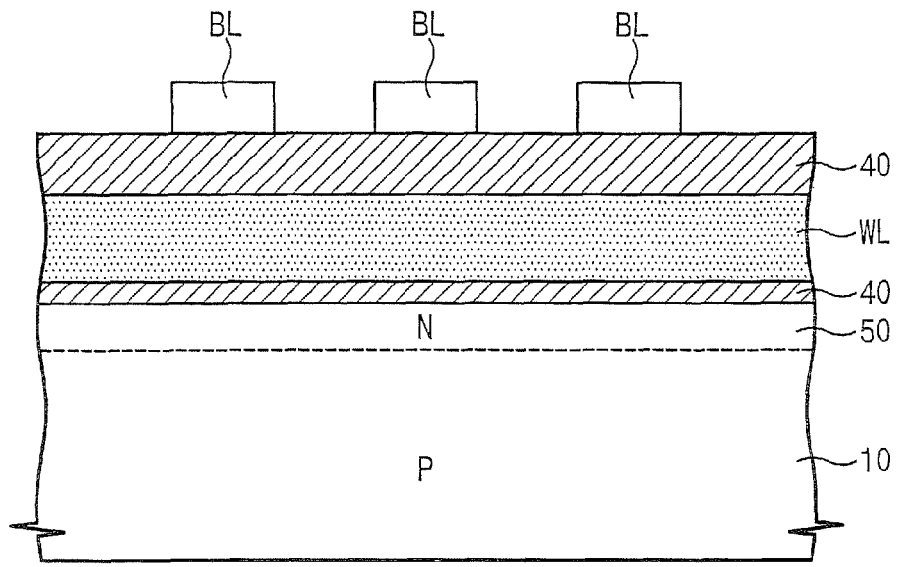

FIGS. 3C through 3E are sectional views along a word line WL. FIG. 3C shows a section on the line with the pillar 20, while FIG. 3D shows a section between adjacent word lines WL. FIG. 3E further shows a section of a word line WL.

Referring to FIG. 3C, the pillars 20 are formed to protrude upward from the semiconductor substrate 10. The bit lines BL are disposed on the pillars 20. Between the pillars 20 is the interlayer insulation film 40. Each of the pillars 20 includes respective source and drain regions 50 and 60, and the channel region 55 defined between the source and drain regions 50 and 60.

Referring to FIG. 3D, an N-type impurity layer 50 is formed on the P-type semiconductor substrate 10, which includes a part of the source region 50. As FIG. 3D corresponds to the section between the word lines WL, the interlayer insulation film 40 and the bit line BL are shown on the N-type impurity layer 50 in FIG. 3D. Referring to FIG. 3E, the word line WL is formed with the interlayer insulation film 40 interposed between the word line WL and the semiconductor substrate 10. In some embodiments, the insulation film between the semiconductor substrate 10 and the word line WL may be formed by the memory layer 30 instead of the interlayer insulation film 40, as will be described below in connection with the related manufacturing process.

The operation of a flash memory device formed in accordance with embodiments of the invention will now be described. Returning to FIGS. 2 and 3A, by selectively addressing a word line WL and a bit line BL, a particular pillar 20 is designated. Only one side of the pillar 20 is designated by one of the word lines WL disposed on the sides of the pillar 20. After selecting one side of the pillar 20, a programming or erasing operation is carried out by injecting charges into or discharging charges from the memory layer 30 on the selected side of the pillar 20.

The materials from which the pillar 20 and the memory layer 30 (i.e., the tunneling insulation film, the charge storage film, and the blocking insulation film) and the word line WL are formed each have an inherent energy bandgap. Energy bandgap differences between adjacent materials may cause potential barriers to be formed at interfaces thereof. Charge injection for programming may be performed in either channel hot-electron mode or Fowler-Nordheim (F-N) tunneling mode. For instance, if positive voltages are applied to the word line WL and the drain region 60 with the source region 60 grounded, electrons are accelerated toward the drain region 50 from the source region 50. The accelerated electrons may be partially captured by the charge storage film and may partially pass through the potential barrier of the tunneling insulation film. As such, when the electrons are captured and accumulated in the charge storage film, a threshold voltage of the vertical channel transistor may increase to provide a programmed state of the device. In contrast, in the bias condition in which an electric field is generated from the channel region 55 to the word line WL by applying a negative voltage to the word line WL, electrons are released from the charge storage film into the semiconductor substrate 10 through the tunneling insulation film. In that case, the threshold voltage of the vertical channel transistor decreases to provide an erased state. Thus, data may be read from a selected vertical channel transistor by determining whether there are electrons captured in the charge storage film based on the threshold voltage level of the transistor.

FIGS. 4A through 4E are sectional views illustrating certain features of the nonvolatile memory device shown in FIG. 2 in accordance with further embodiments of the invention. FIGS. 4A, 4B, 4C, 4D, and 4E are taken along the lines I-I', II-II', III-III', IV-IV' and V-V' of FIG. 2, respectively.

Figure 4A:
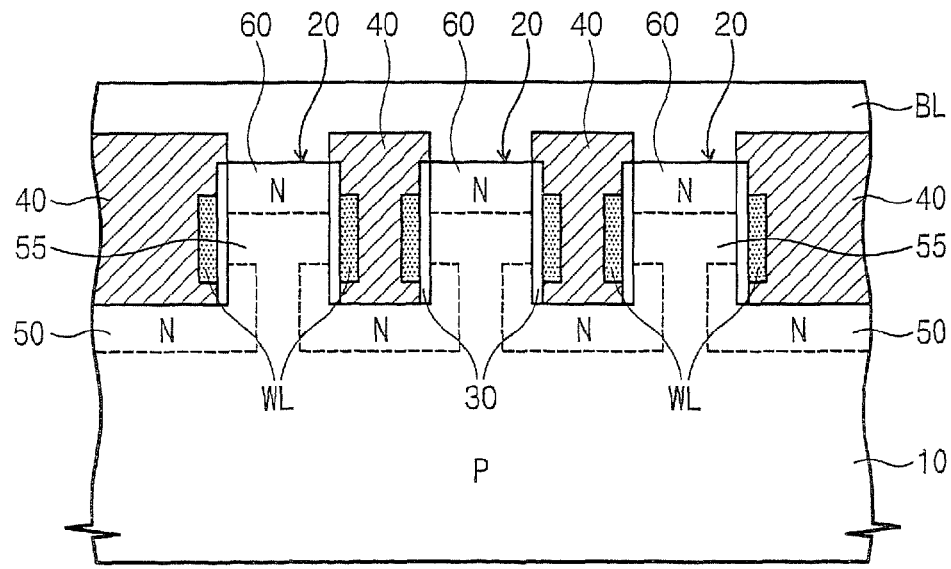

Referring to FIG. 4A, the pillars 20 are formed to protrude upward from the semiconductor substrate 10. On the pillars 20, the bit line BL is formed to connect the pillars 20 with each other. At both sides of the pillar 20 are formed the memory layers 30 and the word lines WL. Spaces between the pillars 20 are filled up with the interlayer insulation film 40. The lower and upper portions of the pillar 20 include source and drain regions 50 and 60 which contain dopant impurities. The source and drain regions 50 and 60 and the word line WL constitute a unit cell of the vertical channel transistor.

In particular embodiments, the source region 50 is disposed at a portion of the bottom of the pillar 20 and between the left and right sides of the adjacent pillars 20, on the semiconductor substrate 10. The channel region 55 of the vertical channel transistor is connected to the semiconductor substrate 10. In other words, in contrast to the structure shown in FIG. 3A, the channel region 55 is conductively connected to the semiconductor substrate 10 without being isolated by the source region 50. Accordingly, in the case of injecting charges into or discharging charges from the charge storage film of the memory layer 30, it is possible to be operate the transistor using different control methods, because it is possible to apply a positive or negative voltage directly to the channel region 55 through the semiconductor substrate 10. In addition, the connection of the channel region 55 with the semiconductor substrate 10 may be helpful in reducing and/or preventing a floating body effect therein.

The floating body effect refers to a phenomenon in which heat or electron-hole pairs accumulate in the body of the semiconductor device when silicon atoms meet with high energy ("hot") carriers generated while the transistor is active. If heat or electron-hole pairs accumulate due to the floating body effect, operational reliability of the device may degrade, and/or device characteristics such as threshold voltage may vary. However, the divided structure of the source region 50, as shown in FIG. 4A, may permit the channel region 55 to be connected with the P-type semiconductor substrate 10, so that a discharging path for the electron-hole pairs is provided, which may reduce and/or prevent the floating body effect therein.

Figure 4B:
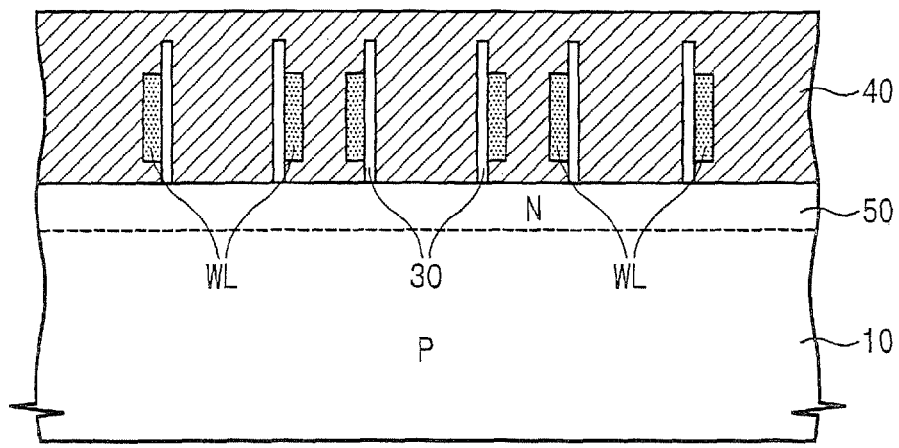

Referring to FIG. 4B, which illustrates a section of a space between adjacent bit lines BL, the memory layers 30 and the word lines WL are arranged along the bit line BL. The pillars 20 illustrated in FIG. 4A do not appear, but the interlayer insulation film 40 is shown in FIG. 4B. Thus, it can be seen that the pillars 20 are electrically isolated from each other by the interlayer insulation film 40. Each pillar 20 may be used as a unit storage element for storing two information bits.

In the embodiments illustrated in FIGS. 4A-4E, the source regions 50 are separated from each other by predetermined distances under the pillars 20, but may be connected under the interlayer insulation film 40 where the pillars 20 are absent. As shown in FIG. 4A, however, the source regions 50 may not interrupt the conductive connections between the channel region 55 and the semiconductor substrate 10. Further, as the source regions 50 are connected to each other as a whole, it is possible to reduce contact spaces for connecting the source regions 50.

Figure 4C:
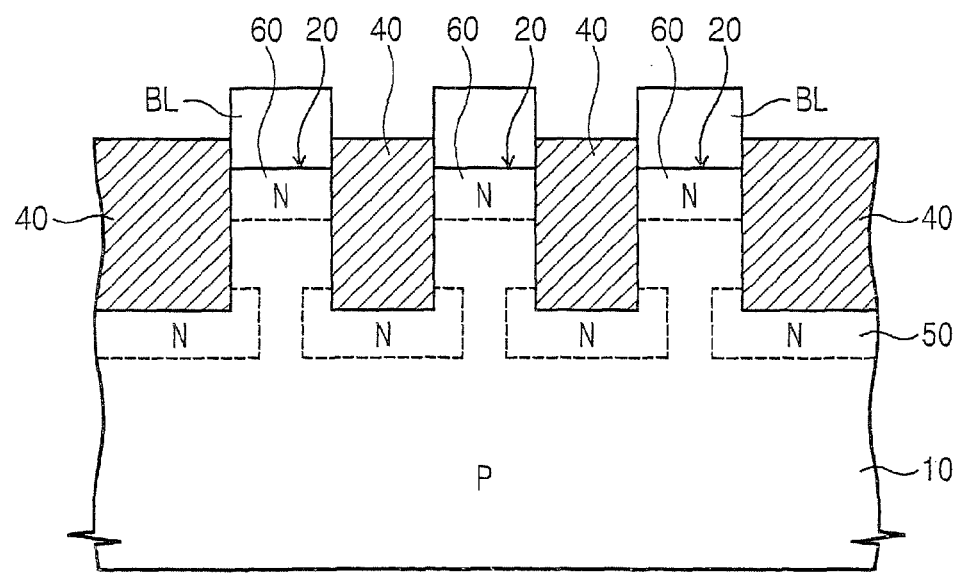
Figure 4D:
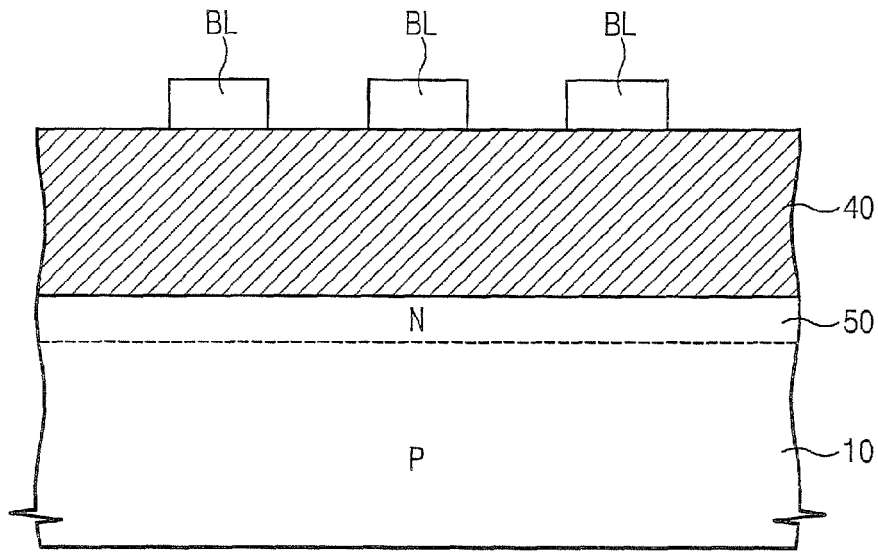
Figure 4E:
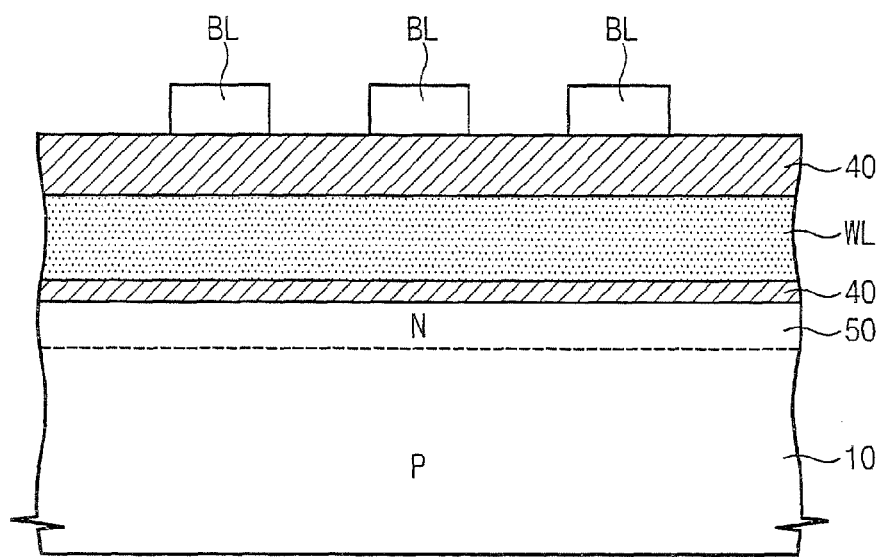

FIG. 4C shows a section on the center of the line with the pillars 30 along the word line WL. As illustrated in FIG. 4C, the source regions 50, which may be formed by implanting dopant impurities, are under the interlayer insulation film 40 between the pillars 20, and are connected to each other as a whole. Furthermore, referring to FIG. 4D, which shows a section along the center of the interlayer insulation film 40 between the adjacent word lines WL, the source regions 50 connected to each other as a whole are partially formed with impurity doped layers. On the other hand, from a section along the word line as shown in FIG. 4E, it can be seen that the source region 50 is formed on the semiconductor substrate 10. The word line WL, and the interlayer insulation film 40 are sequentially stacked on the source region 50. A memory device with the structure shown in FIGS. 4A-4E may operate in a similar manner as that shown in FIGS. 3A through 3E.

The foregoing description relates to a floating-trap flash memory device as an example. However, the structure in which the word lines are disposed at both sides of protruded semiconductor substrate portions so as to construct a vertical channel structure may be applied to various types of memory devices. For example, such a structure may be used for a floating-gate flash memory device having a vertical channel structure if the memory layer 30 is configured to include a floating gate isolated by the insulation film, as illustrated in FIGS. 2, 3A through 3E, and 4A through 4E.

Operations for fabricating the memory device shown in FIGS. 2 and 3A through 3E will now be described. It will be appreciated that the following operations are some of various ways for fabricating a memory device according to some embodiments of the present invention, and that some embodiments of the present invention are not limited to the particular processing steps described herein. The processing operations will be described on the basis of the floating-trap flash memory device as shown in FIGS. 3A and 3E. These operations are also applicable to the fabrication of a device as shown in FIGS. 4A through 4E, although there may be some differences in some of the operations due to the differences between the structures.

FIGS. 5A through FIG. 10A and 5B through 10B are sectional views showing processing steps in accordance with some embodiments of the invention, in which FIGS. 5A, 6A, 7A, 8A, 9A and 10A are taken along the line I-I' of FIG. 2 while FIGS. 5B, 6B, 7B, 8B, 9B, and 10B are taken along the line III-III' of FIG. 2.

Figure 5A:
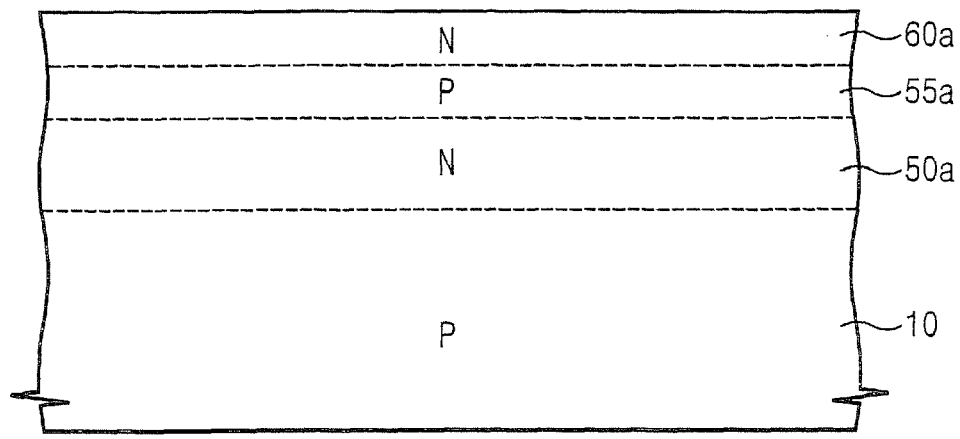
Figure 5B:
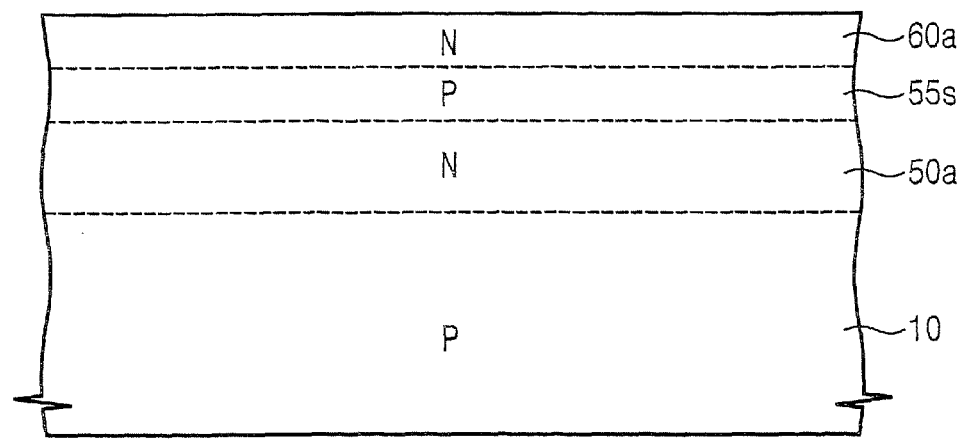

Referring to FIGS. 5A and 5B, dopant impurities are implanted into the P-type semiconductor substrate 10 to form impurity doped layer 60a at the surface of the semiconductor substrate 10 and impurity doped layer 50a at a depth in the substrate 10, respectively. The impurity doped layers 50a and 60a will become the source and drain regions 50 and 60 in a subsequent processing step. In some embodiments, the impurity layers 50a and 60a may be formed at different depths from the surface of the substrate 10 by using different ion implantation energies. In other embodiments, after forming the N-type impurity layer 50a by means of ion implantation or diffusion into the semiconductor substrate 10, a P-type silicon film 55a may be formed by epitaxial growth up from the impurity doped layer 50a. Similarly, the N-type impurity layer 60a may be formed by epitaxial growth on the P-type silicon film 55a. In the case of fabricating the device where the channel region 55 is connected with the semiconductor substrate 10, dopant ions may be implanted thereinto during an intermediate process instead of forming the impurity doped layers 50a and 60a as epitaxial layers.

Figure 6A:
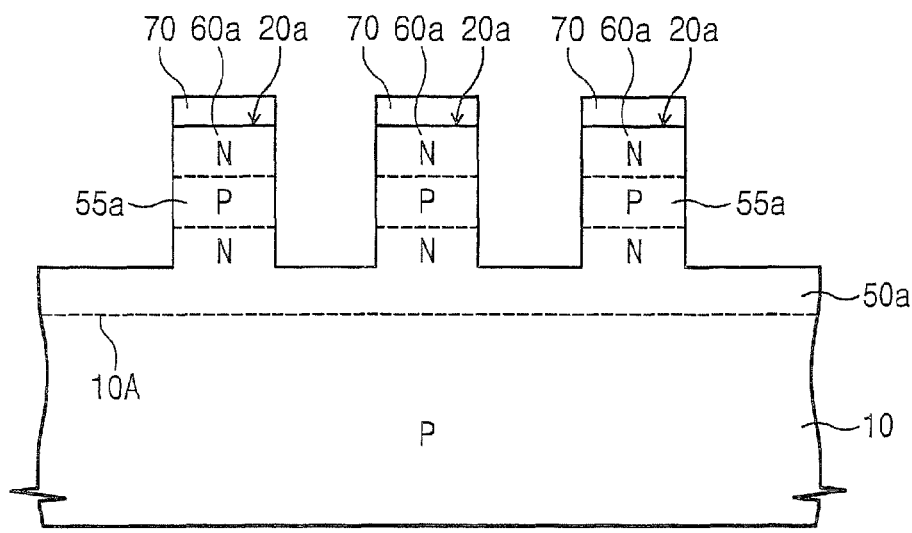
Figure 6B:
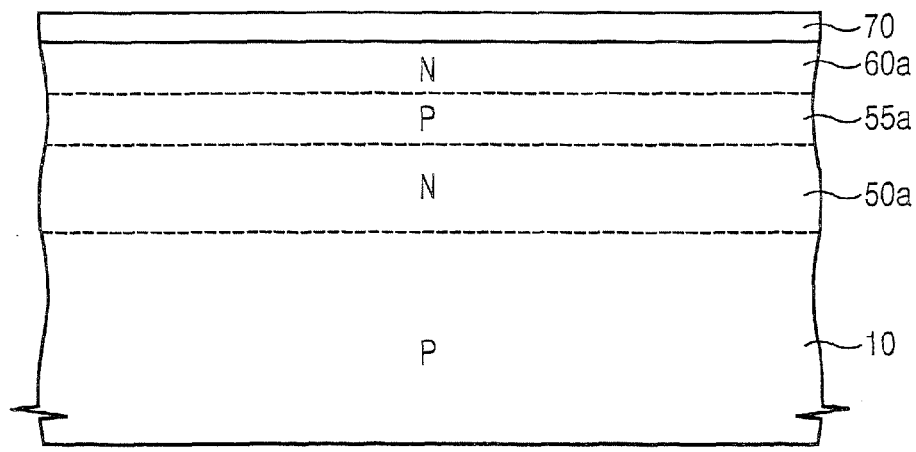

Referring to FIGS. 6A and 6B, a mask 70 is formed on the semiconductor substrate 10 including the impurity doped layers 50a and 60a, and the semiconductor substrate 10 is selectively etched away. The mask 70 may be a typical nitride mask containing a component of silicon nitride. To form the mask 70, a silicon nitride ($Si_3N_4$) film is deposited on the semiconductor substrate 10. A photolithography process with a photoresist film may be carried out to partially etch the silicon nitride film away, forming the mask 70. The mask 70 is arranged to cover the pillars 20 along the lengthwise direction (i.e., along the word line WL), as shown in FIG. 2. The semiconductor substrate 10 is then selectively etched to form a plurality of stripes 20a extending in the vertical (lengthwise) direction. During this process, by properly adjusting the depth of etching against the semiconductor substrate 10, as shown in FIG. 6A, the N-type impurity layer 50a may be partially etched so that portions of the N-type impurity layer 50a are provided in the bottoms of the stripes 20a and a portion of the N-type impurity layer 50a extends along the surface 10A of the semiconductor substrate 10.

Figure 7A:
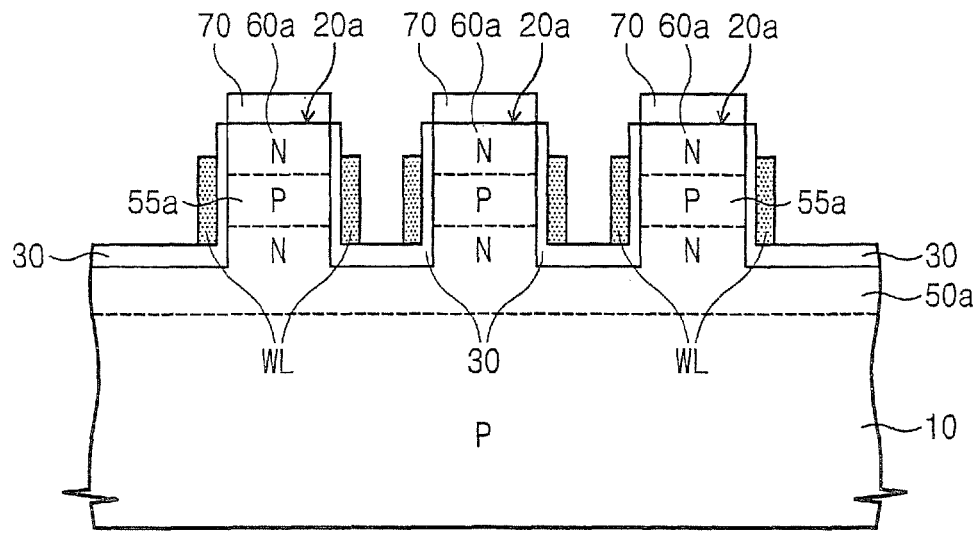
Figure 7B:
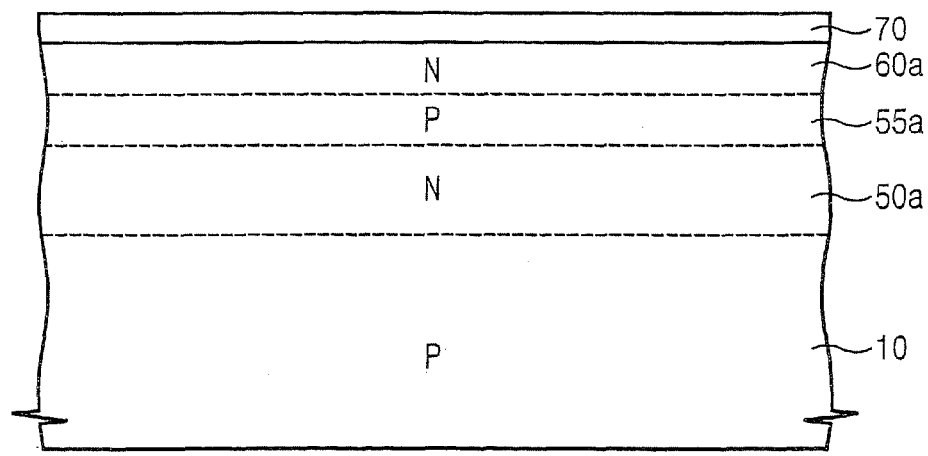

Referring to FIGS. 7A and 7B, the memory layers 30 and the word lines WL are formed on opposing sides (i.e., the left and right sides) of the stripes 20a. The memory layer 30 may include a tunnel insulation film, a charge storage film, and a blocking insulation film. The tunnel and blocking insulation films may include silicon oxide ($SiO_2$), while the charge storage film may include silicon nitride ($Si_3N_4$). The films may be formed by means of thermal oxidation and/or chemical vapor deposition (CVD). After depositing/growing the films, a chemical-mechanical polishing (CMP) process may be carried out to remove the films from the upper side of the mask 70 while leaving the memory layer 30 formed along the surface of the semiconductor substrate 10.

As illustrated in FIG. 7A, the memory layers 30 may be formed on the surface of the semiconductor substrate 10, as well as on both sides of the stripes 20a. However, as channels through which charges move may be formed along the sides of the stripes 20a, the portions of the memory layers 30 on the surface of the semiconductor substrate 10 are used in storing charges. Thus, it is possible to remove the portions of the memory layers 30 from the surface of the semiconductor substrate 10, and then to fill up the regions from which the memory layers 30 are removed with the interlayer insulation film 40 in a subsequent processing step. However, as the memory layers 30 are also made of an insulating material, it may be efficient to leave the memory layers on the surface of the semiconductor substrate 10 without performing an additional process for removing them.

The word lines WL may then be formed by conducting a typical process for generating gate spacers of a MOS transistor, e.g., by means of an etch-back process after depositing a conductive film on the semiconductor substrate 10. After completing the word lines WL, dopant ions may be implanted to form the source and drain regions 50 and 60. In the joint structure of the channel region 55 and the semiconductor substrate 10 as shown in FIG. 4A, the impurity layers 50a and 60a are formed in the substrate 10 at this stage or formed by implanting the dopant ions into the substrate 10 after completing the word lines WL.

To make the channel region 55 connect with the semiconductor substrate 10 as shown in FIG. 4A, the dopant impurities used for forming the source regions 50 into the substrate 10 may not be implanted under the stripes 20a. In order to permit the impurity implantation into specific regions at the first processing time, an additional mask may be needed. However, it may be possible to implant the dopant ions into the specific regions between the stripes 20a by the word lines WL without using an additional mask. After finishing the impurity implantation, an annealing process may be carried out to cure damage arising from the ion implantation processes, so that the dopant atoms are diffused up to the downward edges of the stripes 20a. During this process, the mask 70 covering the stripes 20a may prevent the impurities from penetrating the semiconductor substrate 10 around the bottoms of the stripes 20a, so that the impurity layers 50a are isolated from each other without being connected as a whole. If it is required to connect the impurity layers 50a with each other, an additional ion implantation process may be conducted. The drain regions 60 may also be formed in the same structure by similar processing steps.

Figure 8A:
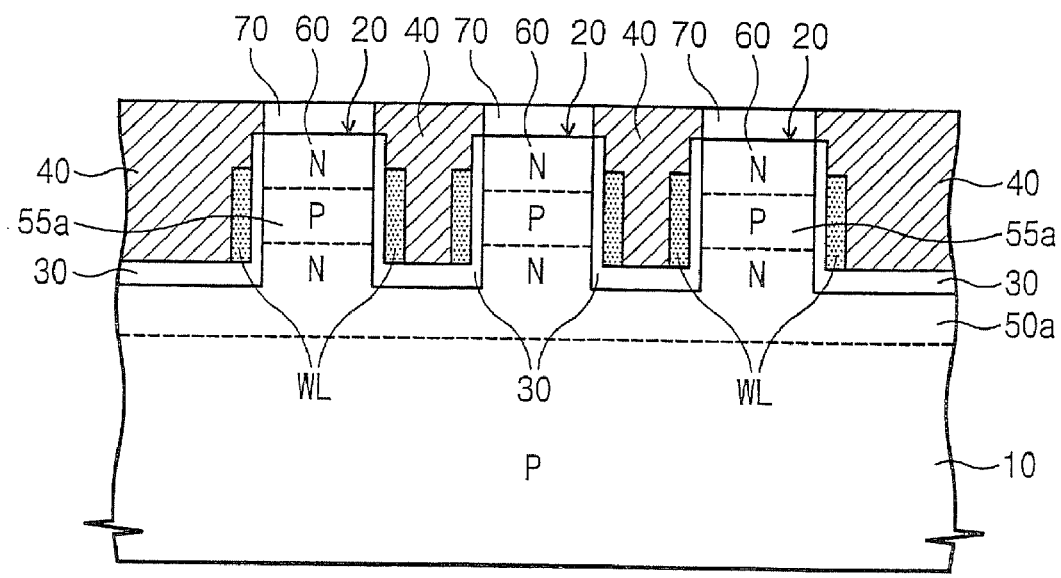
Figure 8B:
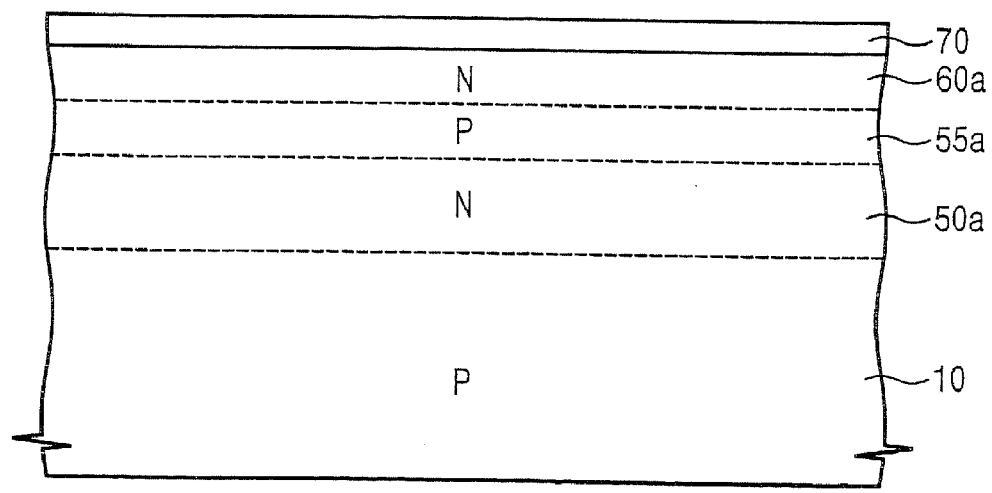

Referring to FIGS. 8A and 8B, the interlayer insulation film 40 is deposited to fill the spaces between the stripes 20a, employing an insulation material such as undoped silicate glass (USG), high density plasma (HDP) oxide, and/or tetraethyl orthosilicate (TEOS) obtained by plasma-enhanced chemical vapor deposition (PECVD). Furthermore, the interlayer insulation film 40 may be planarized until the height of the upper surface of the mask 70 that has been used for constructing the stripes 20a is exposed. This planarization process may use a technique such as CMP.

Figure 9A:
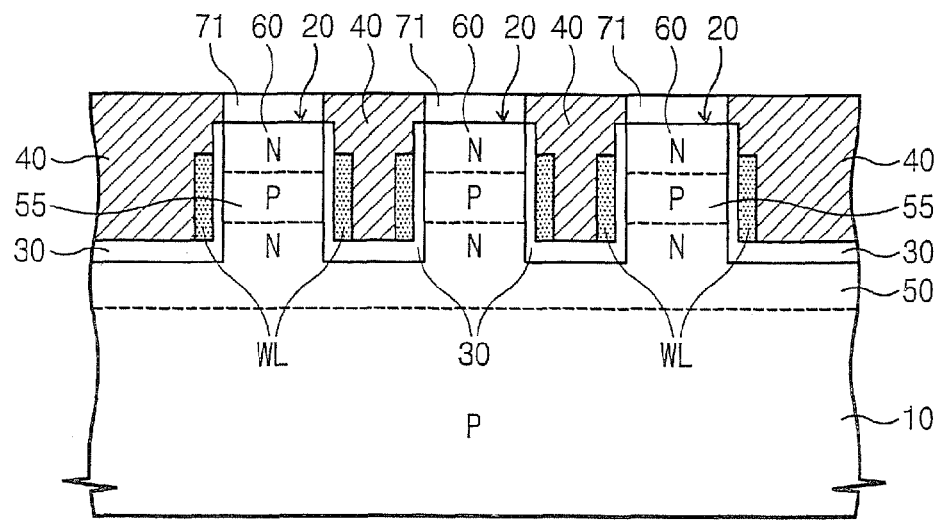
Figure 9B:
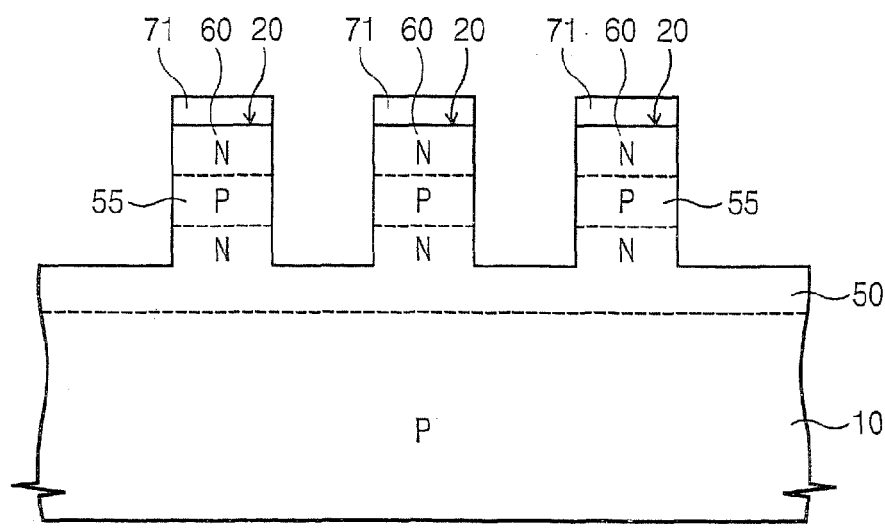

Referring to FIGS. 9A and 9B, the stripes 20a are partially etched to form the pillars 20. For this patterning work, after forming a mask 71 of silicon nitride to define the regions for the pillars 20, the regions exposed by the mask 71 may be removed by means of a dry etching process.

The mask 71 is provided to cover the regions of the pillars 20. The mask 71 may be formed from the mask 70 that was used for constructing the stripes 20a. That is, the mask 70 covering the regions for the stripes 20a may be selectively removed by means of a photolithography process to form the mask 71 to cover the regions at which the pillars 20 are constructed from the stripes 20a. The stripes 20a may then be selectively etched away under the mask 71 to form the pillars 20. After completing the structure of the pillars 20, the source and drain regions 50 and 60 are formed respectively from the impurity layers 50a and 60a.

As noted above, in the case of implanting the dopant atoms into the substrate 10 after forming the word lines WL, an ion implantation process may be performed to connect the impurity layers 50a with each other as a whole. This may be accomplished such that the regions among the pillars 20 are exposed by the mask 71 and the impurity layers 50a, which have been isolated from each other under the stripes 20a, join with each other by the ion implantation into the exposed regions, resulting in the common source region 50a.

Figure 10A:
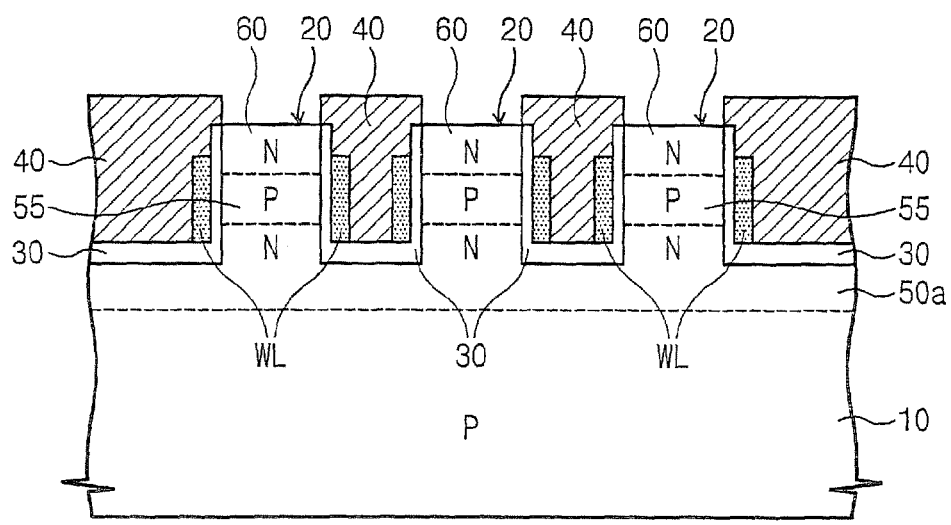
Figure 10B:
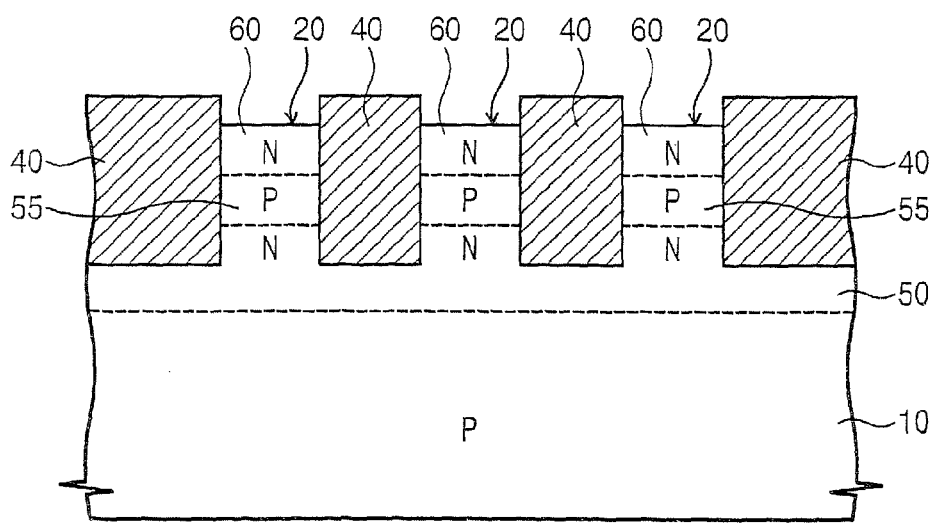

Next, referring to FIGS. 10A and 10B, the interlayer insulation film 40 is again deposited to fill the spaces generated by selectively etching the stripes 20a. The interlayer insulation film 40 may be formed by the same method as the earlier interlayer insulation film 40 that was deposited to fill up the spaces between the stripes 20a. In other words, after filling the spaces that are generated by selectively etching the stripes 20a with, for example, an HDP oxide film while forming the pillars 20, a CMP process may be carried out to planarize the resulting structure. After that, the nitride mask 71 may be removed, for example, by means of a stripping process with phosphoric acid. A conductive material for the bit lines may then be deposited on the resulting structure and patterned to form the bit lines BL, completing the memory device shown in FIGS. 3A through 3E.

During this process, it may be possible to form the drain regions 60 by means of an ion implantation process such that that the upward faces of the pillars 20 are exposed after removing the mask 71. As also as stated above, the drain regions 60 may be formed from the first impurity layers 60a. Since the conductive material for the bit lines is formed by filling the regions from which the mask 71 is removed, the bit lines BL may be formed in self-alignment with the pillars 20.

As described above, according to some embodiments of the invention, a nonvolatile semiconductor memory device may be formed that may be advantageous for high integration, because the data storage capacity of such a device may be twice that of a conventional device having the same area. Moreover, as described above, in embodiments in which the semiconductor substrate is connected with the channel region, it may be possible to control the memory device in various modes, thereby possibly reducing and/or preventing the floating body effect during device operation.

While the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of fabricating a nonvolatile semiconductor memory device comprising:
   forming impurity layers at a surface of a semiconductor substrate;
   selectively etching through at least a portion of the impurity layers to form a plurality of stripes having opposing sidewalls and being arranged along a direction and to define source/drain regions in the stripes;
   forming memory layers and word lines along the sidewalls of the stripes;
   selectively etching the stripes to form pluralities of pillars wherein the word lines extend along adjacent ones of the pillars formed from a respective one of the stripes; and
   forming a bit line connecting a row of adjacent ones of the pillars and crossing above the word lines.

2. The method of claim 1, further comprising:
   depositing a conductive film on the semiconductor substrate including the memory layers; and
   conducting an etch-back process to form the word lines.

3. The method of claim 1, wherein forming the plurality of pillars comprises:
   filling spaces between the word lines with a first insulation film;
   forming a mask to selectively expose a portion of the stripes;
   removing the exposed portion of the stripes to form the pillars; and
   filling spaces between the pillars with a second insulation film.

4. The method of claim 3, wherein the bit line is formed in self-alignment with the pillars.

5. The method of claim 1, wherein each of the memory layers includes a tunneling insulation film, a charge storage film, and a blocking insulation film.

6. The method of claim 1, wherein the impurity layers are disposed in respective ones of the plurality of pillars and are separated vertically from each other to define respective channel regions between the impurity layers.

7. The method of claim 1, wherein the impurity layers are doped with dopants having a first conductivity type and the substrate is doped with dopants having a second conductivity type opposite to the first conductivity type.

8. The method of claim 1, wherein the impurity layers comprise source/drain layers, and wherein selectively etching the semiconductor substrate to form the plurality of stripes defines channel regions between respective ones of the source/drain layers in the stripes.

9. A method of fabricating a nonvolatile semiconductor memory device comprising:
   forming impurity layers having first, second, and third layers at a surface of a semiconductor substrate, the first layer directly contacting the semiconductor substrate;

selectively etching through at least a portion of the impurity layers to form a plurality of stripes having opposing sidewalls and being arranged along a direction and to define source/drain regions in the stripes, wherein at least a portion of the first layer remains un-etched;

forming memory layers and word lines along the sidewalls of the stripes;

selectively etching the stripes to form pluralities of pillars wherein the word lines extend along adjacent ones of the pillars formed from a respective one of the stripes; and forming a bit line connecting a row of adjacent ones of the pillars and crossing above the word lines.

10. The method of claim 9, wherein the substrate and the second layer comprise a first conductivity type and the first and third layers comprise a second conductivity type opposite to the first conductivity type.

11. The method of claim 9, wherein forming the impurity layers comprises forming an epitaxial layer on the semiconductor substrate.

12. The method of claim 9, wherein forming the impurity layers comprises implanting impurities into the semiconductor substrate.

13. The method of claim 10 wherein forming the impurity layers comprises:

forming the first and third layers by doping second using the second conductivity type impurities, wherein the first and third layers are vertically separated from one another to define the second layer therebetween, wherein the second layer comprises a channel layer.

* * * * *